United States Patent
Morris et al.

(10) Patent No.: US 9,897,512 B2
(45) Date of Patent: Feb. 20, 2018

(54) LAMINATE VARIABLES MEASURED ELECTRICALLY

(75) Inventors: Thomas Scott Morris, Lewisville, NC (US); David C. Dening, Stokesdale, NC (US); Chris Botzis, Burlington, NC (US)

(73) Assignee: Qorvo US, Inc., Greensboro, NC (US)

( * ) Notice: Subject to any disclaimer, the term of this patent is extended or adjusted under 35 U.S.C. 154(b) by 246 days.

(21) Appl. No.: 13/447,828

(22) Filed: Apr. 16, 2012

(65) Prior Publication Data

US 2012/0262189 A1    Oct. 18, 2012

Related U.S. Application Data

(60) Provisional application No. 61/476,024, filed on Apr. 15, 2011.

(51) Int. Cl.
   *G01R 27/04* (2006.01)
   *G01M 5/00* (2006.01)
   *B06B 1/00* (2006.01)

(52) U.S. Cl.
   CPC ........ *G01M 5/0083* (2013.01); *G01M 5/0041* (2013.01); *B06B 1/00* (2013.01); *B06B 2201/00* (2013.01); *H01L 2221/00* (2013.01); *Y10T 156/10* (2015.01)

(58) Field of Classification Search
   CPC ....... B06B 1/00; B06B 2201/00; H01L 21/00; H01L 2221/00; H03H 1/00; H03H 2210/00; H03B 1/00; H03B 2200/00; B81B 1/00; B81B 2201/00
   USPC ... 324/633, 519–527, 555, 530–537, 750.01, 324/750.02, 750.03, 750.06, 750.09, 324/750.15, 750.17, 750.18, 750.28, 324/750.29, 759.02, 759.03, 754.21, 324/760.01, 762.03, 762.02, 762.01, 324/761.01, 629, 630, 623, 619
   See application file for complete search history.

(56) References Cited

U.S. PATENT DOCUMENTS 5,374,844 A    12/1994 Moyer
5,612,656 A *   3/1997 Sakamoto ........... H01P 1/20381
                                                            333/175

(Continued)

OTHER PUBLICATIONS

Non-Final Office Action for U.S. Appl. No. 13/405,481, dated Oct. 2, 2013, 8 pages.

(Continued)

*Primary Examiner* — Jermele M Hollington
*Assistant Examiner* — Temilade Rhodes-Vivour
(74) *Attorney, Agent, or Firm* — Withrow & Terranova, P.L.L.C.

(57) ABSTRACT

Embodiments of methods of non-destructively testing whether a laminated substrate satisfies structural requirements are disclosed herein. Additionally, laminated substrates that can be non-destructively tested are also disclosed along with methods of manufacturing the same. To non-destructively test whether the laminated substrates satisfies the structural requirement, an electrical characteristic of the laminated substrate may be detected. Since the detected electrical characteristic is related to a structural characteristic being tested, whether the structural characteristic complies with the structural requirement can be determined based on the electrical characteristic.

18 Claims, 18 Drawing Sheets

(56) References Cited

U.S. PATENT DOCUMENTS

| | | | | |
|---|---|---|---|---|
| 6,229,329 | B1* | 5/2001 | Nakata | G01R 31/2886 324/754.07 |
| 6,370,013 | B1* | 4/2002 | Iino | H01G 4/2325 257/E23.062 |
| 7,459,761 | B2 | 12/2008 | Lin | |
| 2002/0103563 | A1* | 8/2002 | Izawa et al. | 700/121 |
| 2002/0105577 | A1* | 8/2002 | Nikawa | 348/86 |
| 2002/0106820 | A1* | 8/2002 | Nikawa | 438/14 |
| 2004/0155666 | A1* | 8/2004 | Kesil et al. | 324/662 |
| 2006/0023902 | A1* | 2/2006 | Thigpen | H04R 7/04 381/176 |
| 2007/0090854 | A1* | 4/2007 | Hanaoka | G01R 31/2884 324/754.03 |
| 2007/0181976 | A1 | 8/2007 | Toyoda | |
| 2008/0054261 | A1* | 3/2008 | Song | G01R 31/2884 257/48 |
| 2008/0061812 | A1* | 3/2008 | McElfresh | G01R 31/046 324/762.01 |
| 2008/0105964 | A1* | 5/2008 | Iwamura et al. | 257/686 |
| 2008/0150082 | A1 | 6/2008 | Zupac et al. | |
| 2008/0204037 | A1* | 8/2008 | Fukami | G01R 31/2805 324/537 |
| 2009/0249611 | A1* | 10/2009 | Hanhikorpi | G06K 19/07718 29/601 |
| 2009/0253239 | A1 | 10/2009 | Coolbaugh et al. | |
| 2009/0261922 | A1* | 10/2009 | Umeda | H03H 9/02102 333/189 |
| 2009/0283861 | A1 | 11/2009 | Takahashi | |
| 2011/0006784 | A1* | 1/2011 | Yamaguchi et al. | 324/637 |
| 2014/0176165 | A1* | 6/2014 | Wang | G01R 31/2889 324/750.03 |

OTHER PUBLICATIONS

Non-Final Office Action for U.S. Appl. No. 13/405,481, dated May 8, 2014, 10 pages.
Final Office Action for U.S. Appl. No. 13/405,481, dated Dec. 3, 2014, 10 pages.
Non-Final Office Action for U.S. Appl. No. 13/405,481, dated Apr. 28, 2015, 25 pages.
Final Office Action for U.S. Appl. No. 13/405,481, dated Aug. 20, 2015, 26 pages.
Advisory Action for U.S. Appl. No. 13/405,481, dated Nov. 19, 2015, 3 pages.
Final Office Action for U.S. Appl. No. 13/405,481, dated Feb. 10, 2016, 27 pages.
Advisory Action for U.S. Appl. No. 13/405,481, dated Oct. 17, 2016, 3 pages.
Final Office Action for U.S. Appl. No. 13/405,481, dated Nov. 22, 2016, 2016, 28 pages.
Advisory Action for U.S. Appl. No. 13/405,481, dated May 31, 2016, 3 pages.
Final Office Action for U.S. Appl. No. 13/405,481, dated Jul. 6, 2016, 27 pages.
Advisory Action for U.S. Appl. No. 13/405,481, dated Feb. 9, 2017, 3 pages.
Final Office Action for U.S. Appl. No. 13/405,481, dated Mar. 6, 2017, 28 pages.
Advisory Action for U.S. Appl. No. 13/405,481, dated May 17, 2017, 3 pages.
Non-Final Office Action for U.S. Appl. No. 13/405,481, dated Jun. 15, 2017, 27 pages.
Notice of Allowance for U.S. Appl. No. 13/405,481, dated Oct. 27, 2017, 9 pages.

* cited by examiner

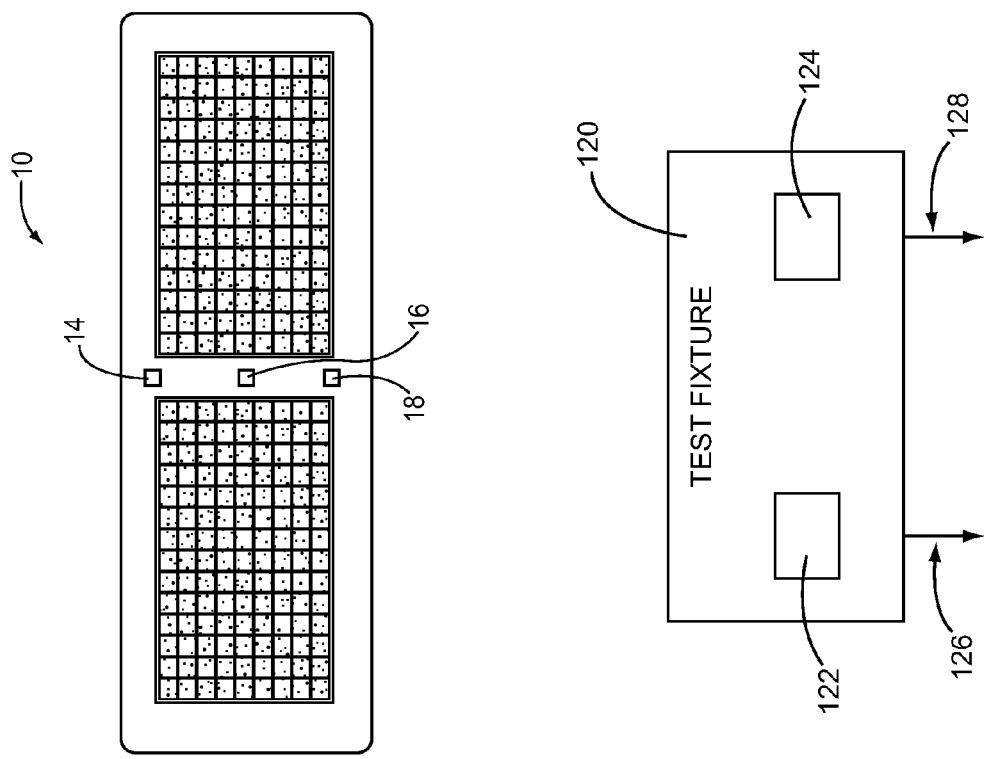

US 9,897,512 B2

LAMINATE VARIABLES MEASURED ELECTRICALLY

RELATED APPLICATIONS

This application claims the benefit of provisional patent application Ser. No. 61/476,024, filed Apr. 15, 2011, the disclosure of which is hereby incorporated herein by reference in its entirety.

FIELD OF THE DISCLOSURE

The present disclosure relates to laminated substrates, methods of manufacturing laminated substrates, and methods of testing whether a laminated substrate satisfies a structural requirement.

BACKGROUND

Semiconductor dies with integrated circuits are often mounted on laminated substrates, such as printed circuit boards (PCBs). These laminated substrates may include one or more laminated substrate layers along with metallic structures that allow for connections to be made to and from electronic components attached to the laminated substrate. However, the structural characteristics of the laminated substrate need to be provided in accordance with structural requirements. Otherwise, the electronic components may not be connected appropriately and/or the integrity of signals transmitted within the laminated substrate may be compromised.

Unfortunately, testing the structural characteristics of manufactured laminated substrates typically involves destructive techniques. For example, manufactured laminated substrates are cross sectioned to inspect the structural characteristics of the manufactured laminated substrates. Since the laminated substrates must be destroyed (at least partially) in order to inspect the structural characteristics, destructive techniques are wasteful and add a significant amount of cost.

Therefore, what is needed are devices and methods for non-destructively testing laminated substrates.

SUMMARY

This disclosure relates to methods of non-destructively testing whether laminated substrates satisfy structural requirements. Additionally, the disclosure further relates to laminated substrates configured to be non-destructively tested and methods of manufacturing the same. In one embodiment, an electrical characteristic of a laminated substrate is detected to test whether the laminated substrate satisfies a structural requirement. A structural characteristic of the laminated substrate being tested and the detected electrical characteristic are related. As a result, once the electrical characteristic has been detected, whether the structural characteristic of the laminated substrate is compliant with the structural requirement can be determined based on the electrical characteristic. In this manner, the laminated substrate does not need to be destroyed and the structural requirement is tested in a non-destructive manner.

In one exemplary embodiment of the laminated substrate, the laminated substrate has a laminated substrate body and a test vehicle operably associated with the laminated substrate body so that an electrical characteristic of the laminated substrate body is measurable from the test vehicle. The electrical characteristic is indicative of a structural characteristic of the laminated substrate body. Accordingly, whether the laminated substrate body complies a structural requirement can be determined by measuring the electrical characteristic from the test vehicle. The test vehicle thus allows for the structural characteristic of the laminated substrate body to be tested without destroying the laminated substrate.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 9 illustrates one embodiment of a test fixture that detects electrical characteristics of the laminated substrate.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Embodiments of methods of non-destructively testing whether a laminated substrate satisfies structural requirements are disclosed herein. Additionally, laminated substrates that can be non-destructively tested are also disclosed along with methods of manufacturing the same. To non-destructively test whether the laminated substrates satisfies the structural requirement, an electrical characteristic of the laminated substrate may be detected. Since the detected electrical characteristic is related to a structural characteristic being tested, whether the structural characteristic complies with the structural requirement can be determined based on the electrical characteristic.

In this regard, a structural characteristic is a morphological property of the laminated substrate. For example, the structural characteristic may be uniformity, orientation, position, alignment, dimension, and/or the like of a structure(s) within the laminated substrate. On the other hand, an electrical characteristic is an electromagnetic property of the laminated substrate. For example, the electrical characteristic may be a resistance, an inductance, a capacitance, a resonant frequency, power rating, distortion factor, open-circuit voltage, return loss, S parameter, phase distortion, and/or the like of a structure(s) within the laminated substrate. These electrical characteristics may be described by Maxwell's equations directly or indirectly by approximations of Maxwell's equations.

Typically, a structural characteristic of the laminated substrate complies with a structural requirement when the structural characteristic is formed within an acceptable error range of a morphological standard. These structural requirements may be set by associations or agencies, such as JEDEC or ANSI. Additionally, structural requirements may come from standards set by external associations or agencies but rather due to a specific application for the laminated substrate. If certain electronic components are to be mounted on the laminated substrate, these electronic components may require that the structural characteristics of the laminated substrate comply with certain structural requirements.

Figure 1:
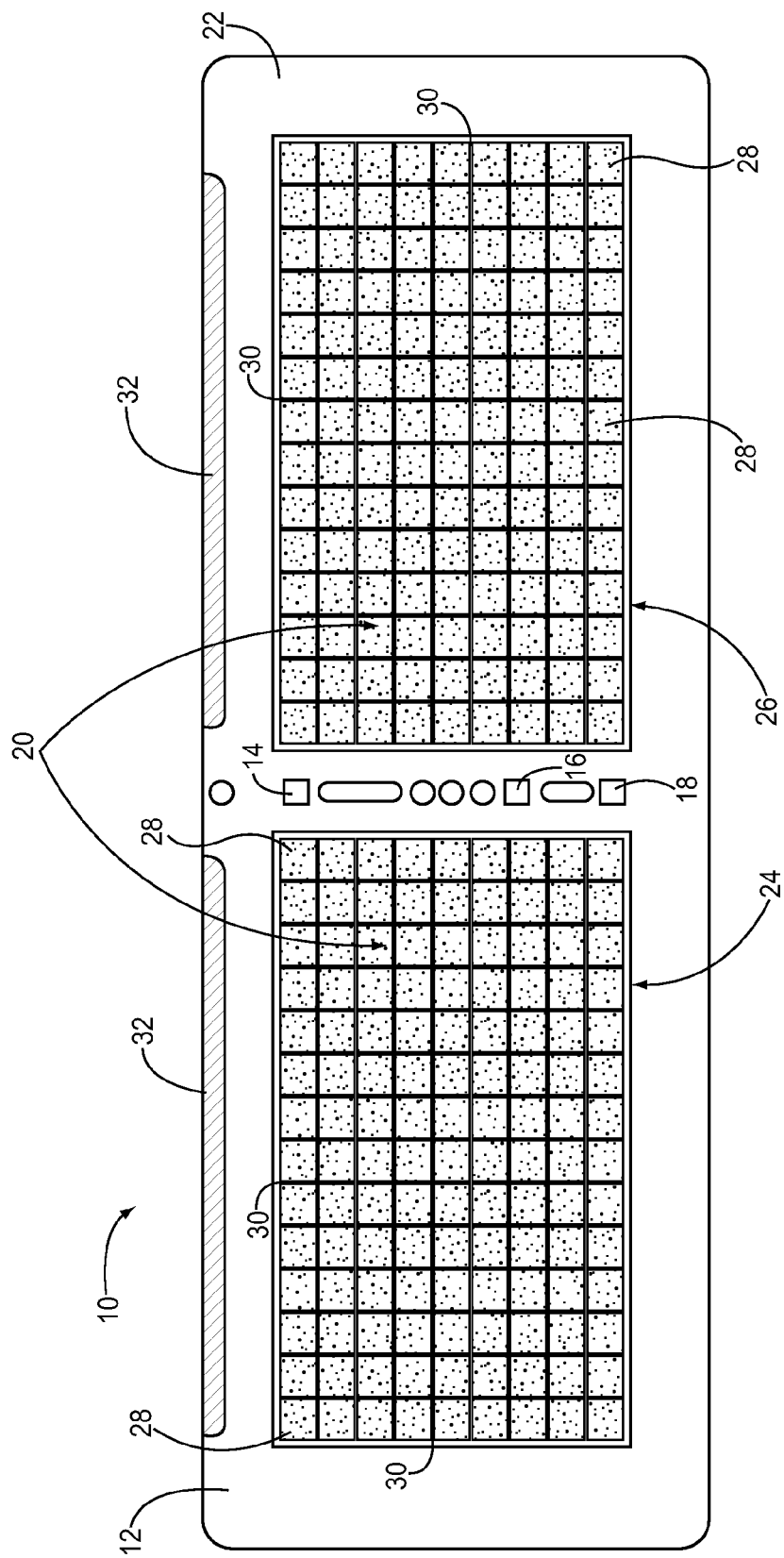
FIG. 1 illustrates one embodiment of a laminated substrate having test vehicles configured to detect electrical characteristics of the laminated substrate so that structural characteristics of the laminated substrate can be non-destructively tested.

FIG. 1 illustrates one exemplary embodiment of a laminated substrate 10. The laminated substrate 10 is configured so that structural characteristics of the laminated substrate 10 can be non-destructively tested. In this embodiment, the laminated substrate 10 includes a laminated substrate body 12 formed from a variety of different structures. Due to the morphology of these structures, the laminated substrate body 12 has structural characteristics. One or more of these structural characteristics may need to comply with structural requirements to ensure that the laminated substrate 10 has been manufactured appropriately. In this manner, electronic components can be mounted properly and operate in accordance with their intended design.

As explained in further detail below, the laminated substrate body 12 shown in FIG. 1 includes a plurality of laminated substrate layers and metallic structures formed on and between the laminated substrate layers. The laminated substrate layers may be formed from laminates such as the FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like. Connections and transmissions paths for input and output signals to electronic components are provided by the metallic structures. The metallic structures may be made from any type of metal such as, for example, copper (Cu), gold (Au), silver (Ag), Nickel (Ni). The metallic material may also include metallic alloys and other metallic materials mixed with or forming ionic or covalent bonds with other non-metallic materials to provide a desired material property. As such, the morphology of the laminated substrate layers and the metallic structures provide the structural characteristics of the laminated substrate body 12. In this example, the laminated substrate 10 has been formed to include various test vehicles 14, 16, 18 and test a number of these structural characteristics.

To test the structural characteristics of interest non-destructively, each of the test vehicles 14, 16, 18 is operably associated with the laminated substrate body 12 so that an electrical characteristic of the laminated substrate body 12 is measurable from each respective test vehicle 14, 16, 18. The electrical characteristic measurable from each of the test vehicles 14, 16, 18 is indicative one of the structural characteristics of the laminated substrate body 12 being tested. In this particular embodiment, different electrical characteristics are measurable from each of the test vehicles 14, 16, 18, as explained in further detail below.

FIG. 1 illustrates a first laminated substrate layer 20 and the test vehicles 14, 16, 18 are exposed through a solder mask 22 of the laminated substrate body 12. In this embodiment, the test vehicles 14, 16, 18 integrated into and form part of the laminated substrate body 12. Additionally, the laminated substrate body 12 forms an electronic component section 24 and an electronic component section 26, which are exposed through the solder mask 22. Each electronic component section 24, 26 defines an array of component areas 28. One or more electronic components (not shown) may be mountable on these component areas 28. These electronic components may be any type of electronic component. For example, electronic components may be an electronic circuit built on a semiconductor die, such as a processor, volatile memory, non-volatile memory, a radio frequency circuit, or a micro-mechanical system (MEMS) device. Electronic components may also be electrical devices such as filters, capacitors, inductors, and resistors or electronic circuits having any combination of these electronic devices.

The component areas 28 in FIG. 1 are separated by channels 30. The channels 30 may be formed through cuts into the laminated substrate body 12. Portions of the metallic layers formed within the laminated substrate body 12 can be exposed by the channels 30. For example, metallic structures such as vias and traces may be exposed by the channels 30. In this manner, the electronic component(s) mounted on the component area 28 can form the appropriate connections to receive and transmit internal and external signals. Cuts are also provided through the solder mask 22 and further into the laminated substrate body 12 to expose the mold gates 32.

As shown in FIG. 1, the test vehicles 14, 16, 18 are formed on the laminated substrate body 12 between the electronic component sections 24 and 26. As a result, the test vehicles 14, 16, 18 do not waste the portion of the laminated substrate body 12 for mounting electronic components. The test vehicles 14, 16, 18 have been designed so that the electrical characteristics measurable from the test vehicles 14, 16, 18 are indicative of a particular structural characteristic of the laminated substrate body 12. In this exemplary embodiment, the first test vehicle 14 is configured to measure a resonant frequency resulting from the first laminated substrate layer 20. More specifically, the first test vehicle 14 is configured so that a thickness of the first laminated substrate layer 20 is related to the resonant frequency measurable from the first test vehicle 14. Thus, the structural characteristic testable from the first test vehicle is the thickness of the first laminated substrate layer 20 of the laminated substrate 10. Once the thickness of the first laminated substrate layer 20 is known, whether the structural characteristic of the laminated substrate 10 is compliant with a structural requirement can be determined based on the electrical characteristic. For instance, whether the thickness of the first laminated substrate layer 20 is within a thickness range can be determined based on the resonant frequency.

Analogously, the third test vehicle 18 is also configured to measure a resonant frequency. However, the resonant frequency measurable from the third test vehicle 18 results from a second laminated substrate layer (not shown in FIG. 1). The thickness of the second laminated substrate layer is related to the resonant frequency measured from the third test vehicle 18. Accordingly, whether the thickness of the second laminated substrate layer is within the thickness range can be determined from the resonant frequency. By using the test vehicles 14, 18, whether the thickness of the first laminated substrate layer 20 and the second laminated substrate layer comply with the thickness range can be determined without destroying the laminated substrate 10.

The structural characteristic testable from the second test vehicle 16 is a uniformity of one or more of the laminated substrate layers of the laminated substrate 10. In this regard, the second test vehicle 16 has a resistive component interweaved within one or more of the laminated substrate layers of the laminated substrate body 12. The second test vehicle 16 is configured so that a resistance or resistances of the resistive component indicate the uniformity of one or more of the laminated substrate layers. The resistance(s) of the resistive component is detectable from the second test vehicle 16. Thus, the electrical characteristic measurable from the second test vehicle 16 is a resistance and/or resistances of the resistive component. For example, if the resistance measured from the second test vehicle 16 is approximately equal to a control resistance, one or more of the laminated substrate layers comply with a planar uniformity requirement for the laminated substrate layers. In contrast, if the resistance is greater than approximately the control resistance, the uniformity of one or more of the laminated substrate layers fails to comply with the planar uniformity requirement. In this manner, whether the laminated substrate layers have been formed with sufficient uniformity can be tested without destroying the laminated substrate 10.

Figure 1A:
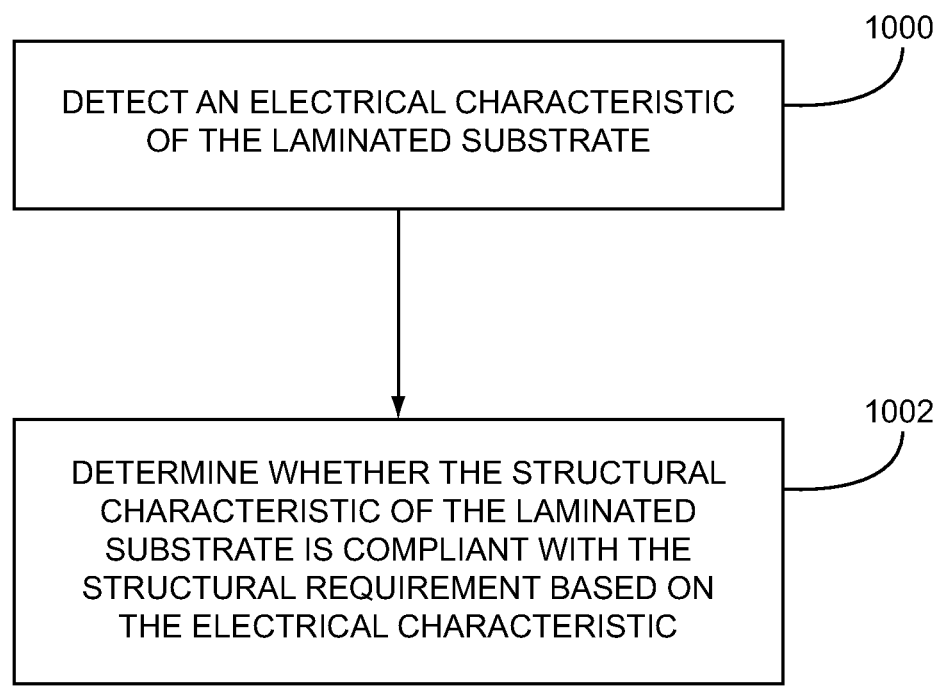
FIG. 1A illustrates exemplary procedures for non-destructively testing whether the structural characteristics of the laminated substrate comply with structural requirements.

Referring now to FIGS. 1 and 1A, FIG. 1A illustrates exemplary procedures that may be implemented to non-destructively test whether the laminated substrate 10 satisfies a structural requirement. As explained in further detail below, different implementations of the exemplary procedures shown in FIG. 1A may be applied to the various test vehicles 14, 16, 18 in the laminated substrate body 12 of the laminated substrate 10. To begin, an electrical characteristic of the laminated substrate 10 is detected (procedure 1000). As discussed above, a structural characteristic of the laminated substrate 10 is related to the detected electrical characteristic. With regards to the various test vehicles 14, 16, 18, different electrical characteristics of the laminated substrate 10 are detectable from each of the test vehicles 14, 16, 18. The electrical characteristics may be detected by the appropriate electronic measurement device.

In particular, the first test vehicle 14 is operably associated with the first laminated substrate layer 20 so the resonant frequency measurable from the first test vehicle 14. The resonant frequency measurable from the first test vehicle 14 depends on the thickness of the first laminated substrate layer 20 in the laminated substrate body 12. Analogously, the test vehicle 18 is operably associated with the second substrate layer so the resonant frequency measurable from the test vehicle 18 depends on the thickness of the second substrate layer in the laminated substrate body 12. While the structural characteristic testable by the first test vehicle 14 and third test vehicle 18 is the thickness of one laminated substrate layer (the first laminated substrate layer 20 for the first test vehicle 14, the second laminated substrate layer for the third test vehicle 18, respectively) of the laminated substrate 10, in alternative embodiments, the structural characteristic testable from one of the test vehicles may be the thickness of more than one of the laminated substrate layers of the laminated substrate 10.

With regards to the second test vehicle 16, the electrical characteristic measurable is the resistance(s) of the resistive component provided by the second test vehicle 16. The resistive component is interweaved within at least of the laminated substrate layers of the laminated substrate body 12. The resistance of the resistive component is thus related to the uniformity of the laminated substrate layers. For example, if the laminated substrate layers are sufficiently planar, the resistive component interweaved between the laminated substrate layers is not broken and thus the resistance will be approximately equal to the control resistance. On the other hand, if the laminated substrate layers are formed insufficiently uniform, the interweaved resistive component will be broken and the resistance measurable from the second test vehicle 16 will be significantly higher than the control resistance.

To detect the electrical characteristic of the laminated substrate 10, a test signal may be transmitted into the test vehicles 14, 16, 18 by the appropriate electronic measurement device. The corresponding electrical characteristic of the test vehicle 14, 16, 18 is measured from the test signal. For example, an oscilloscope may be coupled to the first test vehicle 14 (or the third test vehicle 18) that transmits a test signal into the first test vehicle 14. Typically, the oscilloscope is operable to transmit the test signal at various frequencies. The response to the test signal from the oscilloscope may be plotted on a display device of the oscilloscope and/or the like. By transmitting the test signal into the first test vehicle 14 at various frequencies, the oscilloscope measures the resonant frequency of the first test vehicle 14 (or the third test vehicle 18) from the test signal. With regard to the second test vehicle 16, an ohmmeter may be utilized to detect the resistance(s) of the resistive component in the second test vehicle 16. The ohmmeter transmits a test signal into the second test vehicle 16. From the test signal transmitted into the second test vehicle 16, the ohmmeter measures the resistance of the resistive component.

Once the electrical characteristic of the laminated substrate 10 has been detected, an individual or a computing system may determine whether the structural characteristic of the laminated substrate 10 is compliant with the structural requirement based on the electrical characteristic (procedure 1002). With regard to the resonant frequency detected from the first test vehicle 14 (or the resonant frequency detected from the third test vehicle 18), the thickness of the first laminated substrate layer 20 (or the thickness of the second laminated substrate layer with regards to the third test vehicle 18) can be determined from the following two equations:

$$f = \frac{1}{2\pi\sqrt{LC}} \quad \text{Equation 1}$$

f=resonant frequency
L=inductance of test vehicle
C=Capacitance of test vehicle $$t = \frac{\in XDXA}{C} \quad \text{Equation 2}$$

t=thickness of laminated substrate layer
∈=Permittivity of laminate
D=Dielectric constant of laminate
A=Area for capacitance With reference to equation 1, embodiments of the first test vehicle 14 and third test vehicle 18 may be formed so that the inductance of the first test vehicle 14 and third test vehicle 18 have a relatively small variance in inductance due to deviations in manufacturing. Based on empirical measurements, the inductance of the test vehicles 14 and 18 may vary by as little as approximately one percent (1%). Accordingly, the inductance of the first test vehicle 14 and third test vehicle 18 may be approximated to have the same inductance as an independent inductor structure designed in the same manner as an inductor component of the first test vehicle 14 and third test vehicle 18. In this manner, inductances can be eliminated as a variable from the equation 1. This inductance may be measured across multiple product lots and vendors to ensure that the inductance being utilized is accurate.

Once the resonant frequency has been measured from the test vehicles 14 and 18, the capacitance of the test vehicles 14 and 18 may be calculated from equation 1. In particular, embodiments of the first test vehicle 14 and the third test vehicle 18 may be configured so that the respective laminated substrate layer (the first laminated substrate layer 20 for the first test vehicle 14 and the second laminated substrate layer for the third test vehicle 18) is used as a dielectric layer of a capacitive component. Once the capacitance of this capacitive component is calculated from equation 1, the thickness of the respective laminated substrate layer can be calculated from the equation 2. The permittivity and the dielectric constant of each of the laminated substrate layers may be described in manufactured data sheets for the laminate used to form the laminated substrate layers. Also the capacitive area of the respective first test vehicle 14 and third test vehicle 18 may be known for the given design. Whether the thickness of the first laminated substrate layer 20 or the second laminated substrate layer is within the thickness range can thus be determined based on the thickness calculated from equation one and equation 2.

Empirical test have been performed to confirm that the thickness calculated in accordance with the equations above are sufficiently accurate to determine whether the thickness of the first laminated substrate layer 20 and the second laminated substrate layer comply with structural requirements. The empirical tests compared the thickness determined from electrical measurements, as described above in FIG. 1A, and the thickness determined from cross-sectional measurements. The thickness determined from electrical measurements and the thickness determined from cross-sectional measurements have a discrepancy of about 5 micrometers or less across multiple manufactured strips, lots, and vendors. This is sufficiently accurate to determine whether the thickness in within a required thickness range. Thus, by calculating the thickness from the electrical measurements, a person or computing device may determine whether the thickness of the first laminated substrate layer 20 or the second laminated substrate layer is within the thickness range without destroying the laminated substrate 10.

With regard to the second test vehicle 16, a control unit designed with the same structure as the second test vehicle 16 can be formed to determine a control resistance. In one embodiment, the control resistance for a resistive component interweaved within each of the laminated substrate layers in the laminated substrate body 12 is about 0.2 ohms. Thus, if the measured resistance from the second test vehicle 16 is around 0.2 ohms, the interweaved resistant component of the second test vehicle 16 is contiguous and has not been broken. In this case, the uniformity of the laminated substrate layers complies with a planar uniformity requirement of the laminated substrate layers. Thus, once the resistance is measured, an individual or a computing device can determine whether the laminated substrate layers comply with the planar uniformity requirement. On the other hand, if the resistance of the second test vehicle 16 is significantly greater than 0.2 ohms, the individual or computing device can determine that the interweaved resistive component is broken and the uniformity of the laminated substrate layers do not comply with the planar uniformity requirement.

Figure 2:
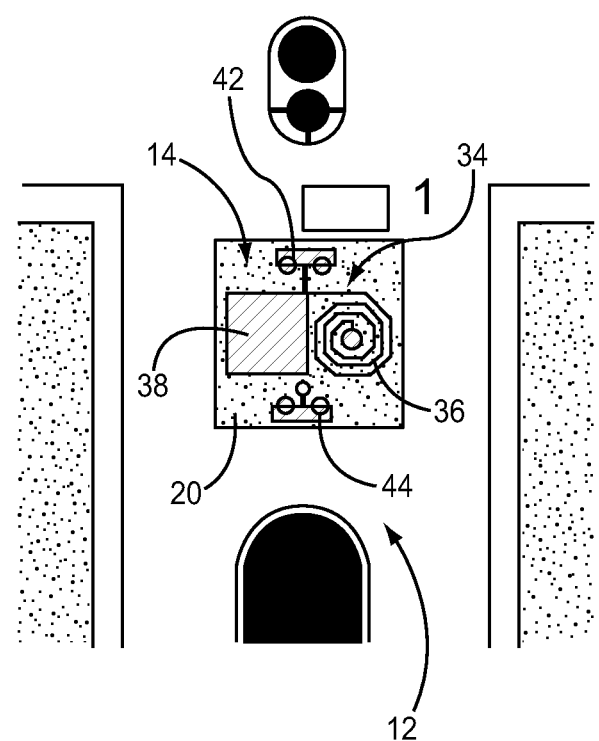
FIG. 2 illustrates one embodiment of a first test vehicle in the laminated substrate shown in FIG. 1 for detecting an electrical characteristic related to a thickness of a first laminated substrate layer in the laminated substrate.

FIG. 2 illustrates one embodiment of the first test vehicle 14 shown in FIG. 1. The first test vehicle 14 has been integrated into the laminated substrate body 12. In this particular embodiment, the first test vehicle 14 includes a resonant circuit 34 having an inductive component 36 and a capacitive component 38. FIG. 2 illustrates a first plate of the capacitive component 38 formed in a first metallic layer of the laminated substrate body 12. The second plate of the capacitive component 38 is formed beneath the first laminated substrate layer 20 so that the plates of the capacitive component 38 sandwich the first laminated substrate layer 20. In this manner, the first laminated substrate layer 20 is configured to provide a dielectric of the capacitive component 38 so that a capacitance of the capacitive component 38 depends on the thickness of the first laminated substrate layer 20. It should be noted that in other alternative embodiments, the resonant frequency may be based on a thickness of more than one of the laminated substrate layers. In these alternative embodiments, multiple laminated substrate layers are configured to provide a dielectric of the capacitive component 38 so that the capacitance of the capacitive component 38 depends on the thickness of the multiple laminated substrate layers. Input terminals 42 are also formed by the first metallic layer to receive a test signal from an oscilloscope along with output terminals 44 so that the oscilloscope can determine the frequency response of the first test vehicle 14.

Figure 3:
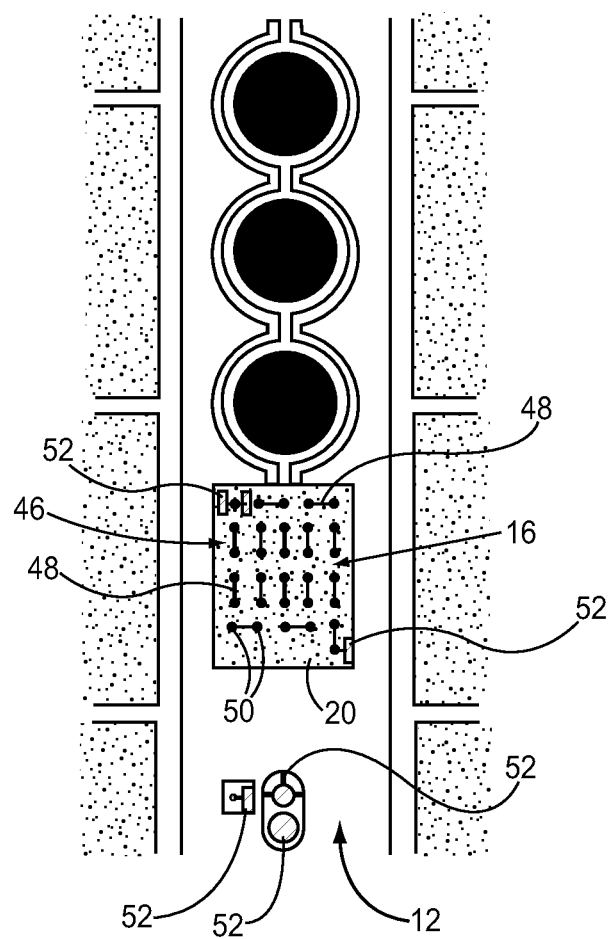
FIG. 3 illustrates one embodiment of a second test vehicle in the laminated substrate shown in FIG. 1 for detecting an electrical characteristic related to a uniformity of the laminated substrate layers in the laminated substrate.

FIG. 3 illustrates one embodiment of the second test vehicle 16 in the laminated substrate body 12 of the laminated substrate 10 shown in FIG. 1. The second test vehicle 16 includes a resistive component 46 interweaved between the laminated substrate layers of the laminated substrate body 12. FIG. 3 shows a first segment of the resistive component 46 formed on the first laminated substrate layer 20. As shown in FIG. 3, the resistive component 46 has traces 48 and vias 50. The traces 48 shown in FIG. 3 are formed by the first metallic layer of the laminated substrate body 12. Other metallic traces (not shown in FIG. 3) are formed to connect the vias 50 shown in FIG. 3 by a second metallic layer (that is below the first laminated substrate layer 20 in the laminated substrate body 12. The vias 50 thus connect the traces 48 on the first laminated substrate layer 20 and the traces below the first laminated substrate layer 20 so that the resistive component is interweaved within the first laminated substrate layer 20. Other similar structures are provided as explained in further detail below for the other laminated substrate layers within the laminated substrate body 12. Input/output terminals 52 are provided by the second test vehicle 16 to measure resistances of the resistive component 46.

Figure 4:
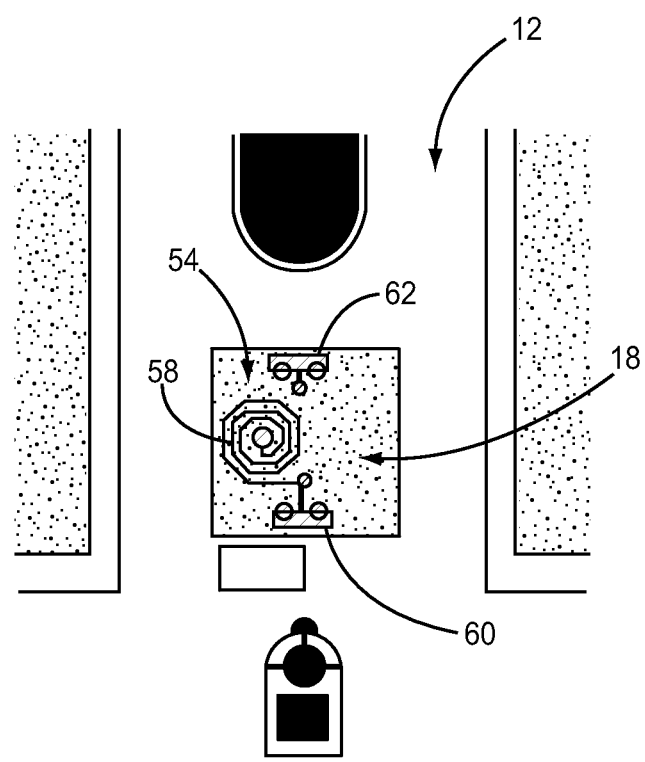
FIG. 4 illustrates one embodiment of a third test vehicle in the laminated substrate shown in FIG. 1 for detecting an electrical characteristic related to a thickness of a second laminated substrate layer of the laminated substrate.

FIG. 4 illustrates one embodiment of the third test vehicle 18 shown in FIG. 1. The third test vehicle 18 also includes a resonant circuit 54. The resonant circuit includes an inductive component 58 and a capacitive component (not shown in FIG. 4). The inductive component 58 is formed by the first metallic layer of the laminated substrate body 12. However, the capacitive component sandwiches the second laminated substrate layer (not shown in FIG. 4). Accordingly, the resonant circuit 54 has a resonant frequency based on a thickness of the second laminated substrate layer. In particular, the capacitive component is provided so that the second laminated substrate layer is a dielectric of the capacitive component. In this manner, the capacitance of the capacitive component depends on the thickness of the second laminated substrate layer. Input terminal 60 is provided to transmit a test signal from an oscilloscope into the third test vehicle 18. The test signal is output back to the oscilloscope from an output terminal 62 so that the resonant frequency of the third test vehicle 18 can be measured from the test signal.

FIGS. 5A-5K illustrates exemplary procedures that may be utilized to manufacture the laminated substrate 10 in FIG. 1. In particular, the exemplary procedures shown in FIGS. 5A-5K relate to the forming of the laminated substrate body 12. As described in further detail below, the test vehicles 14, 16, 18 are operably associated with the laminated substrate body 12 so that the electrical characteristic measurable from the test vehicle 14, 16, 18 is indicative of the structural characteristic of the laminated substrate body 12. In this embodiment, the test vehicles 14, 16, 18 are formed while forming the laminated substrate body 12 as explained in further detail below.

Figure 5A:
FIGS. 5A-5K illustrates exemplary procedures that may be implemented to manufacture the laminated substrate shown in FIG. 1.
Figure 5B:
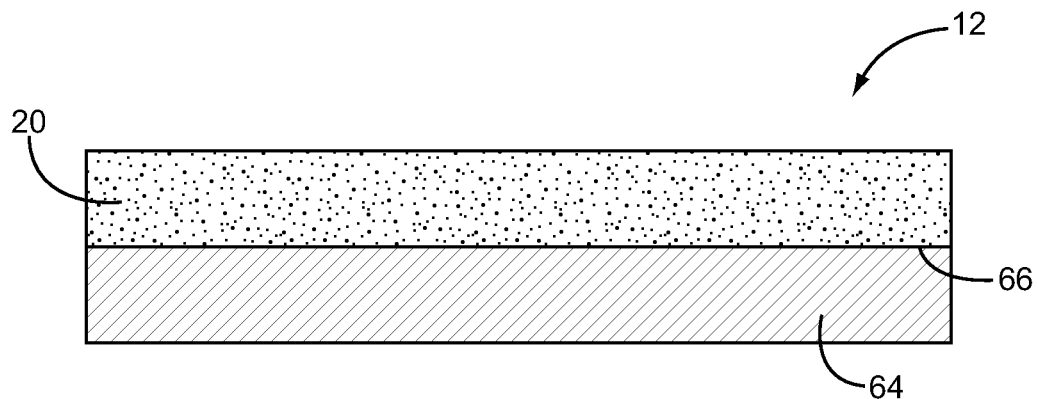
Figure 5C:
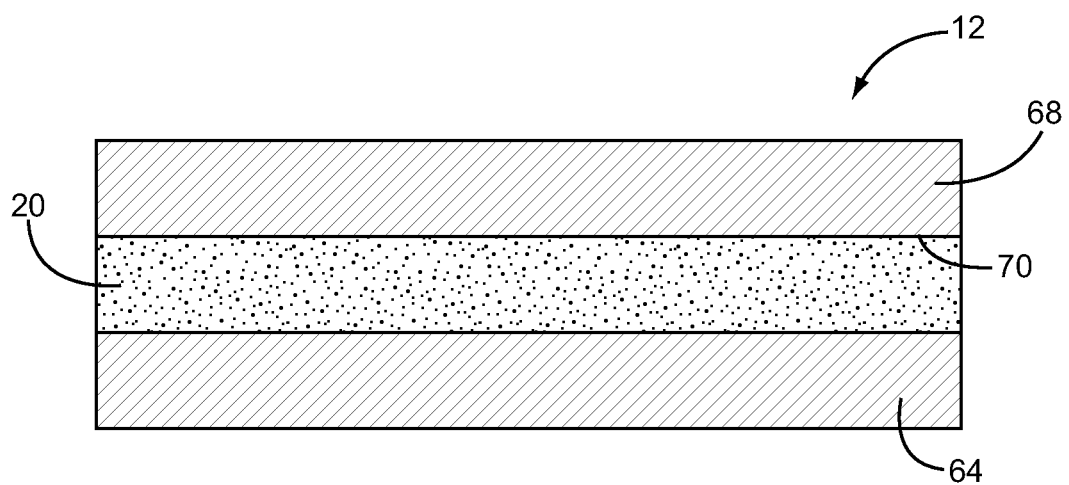

To begin, the first laminated substrate layer 20 is formed (FIG. 5A). Subsequently, a first metallic layer 64 of the laminated substrate body 12 is formed on a first side 66 of the first laminated substrate layer 20 (FIG. 5B). The first metallic layer 64 may be patterned into the desired metallic components. Furthermore, vias may be formed on the first metallic layer 64 through the first laminated substrate layer 20 to connect the first metallic layer 64 to other metallic structures. A second metallic layer 68 is then formed on an oppositely disposed side 70 of the first laminated substrate layer 20 (FIG. 5C). The second metallic layer 68 may be patterned into the desired metallic components.

Figure 5D:
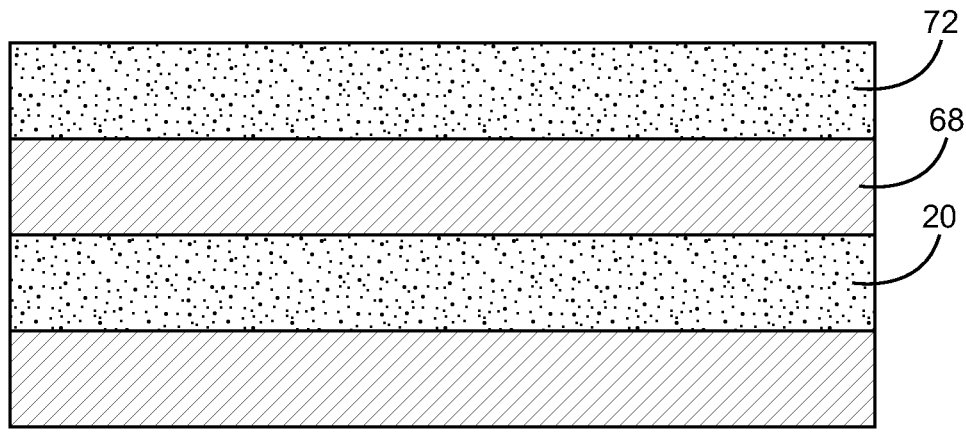
Figure 5E:
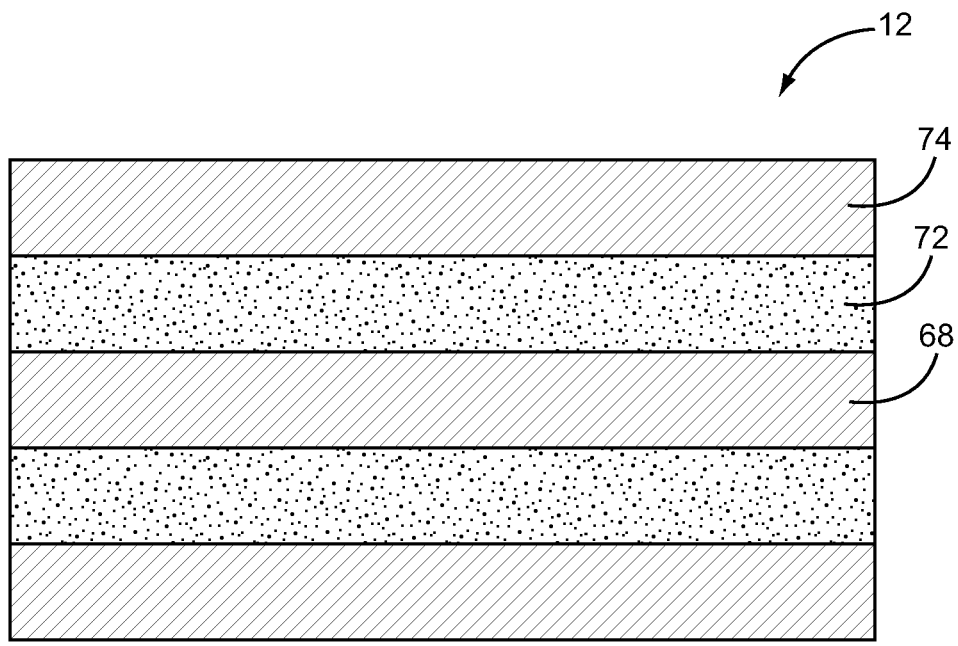
Figure 5F:
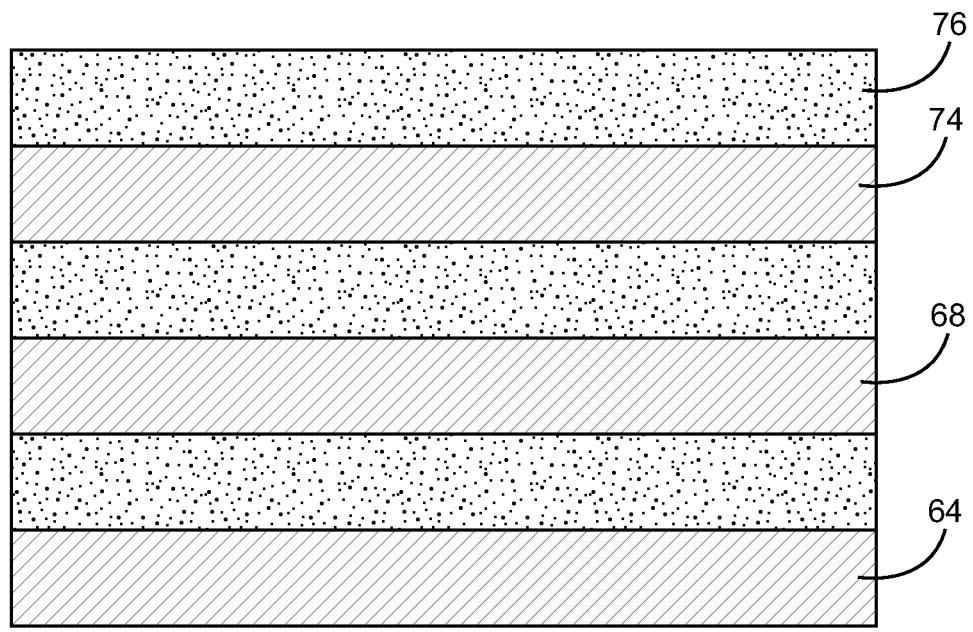
Figure 5G:
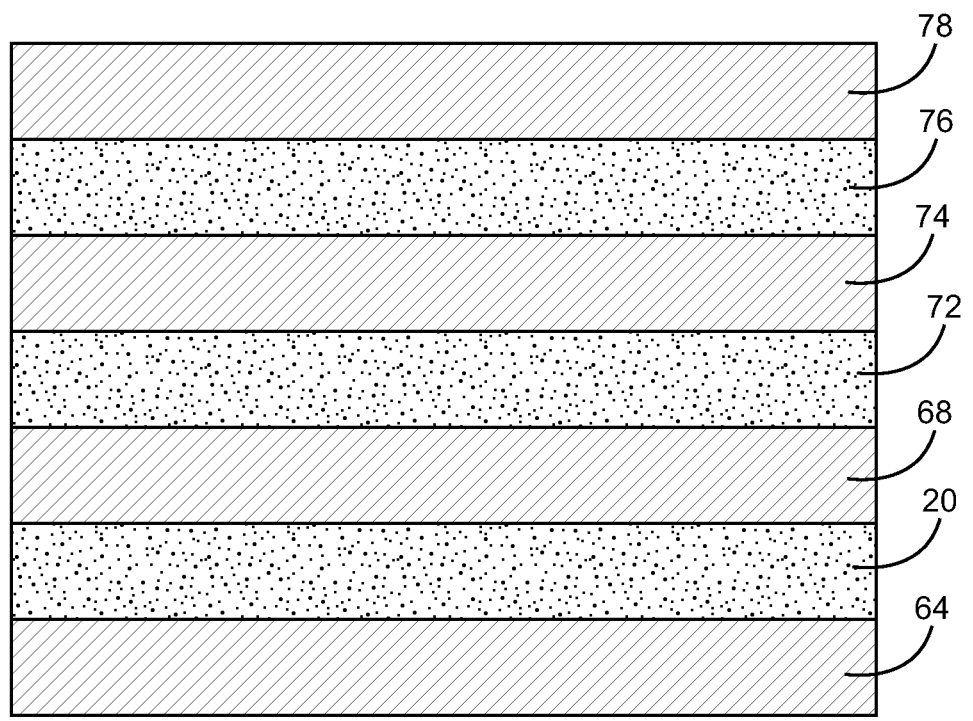

Next, a second substrate layer 72 is formed on the second metallic layer 68 (FIG. 5D). Additionally, vias may be formed through the second substrate layer 72 to make connections to the second metallic layer 68. Subsequently, a third metallic layer 74 is formed over the second substrate layer 72 (FIG. 5E). The third metallic layer 74 may then be patterned to form the appropriate metallic components. The third metallic layer 74 may be coupled to the vias formed through the second substrate layer 72 to connect the third metallic layer 74 to the second metallic layer 68. A third laminated substrate layer 76 is then formed over the third metallic layer 74 (FIG. 5F). Vias may be formed through the third laminated substrate layer 76 in order to connect to the third metallic layer 74 to other metallic structures. As vias may be formed from the third metallic layer 74, second metallic layer 68, and first metallic layer 64 each of the structures formed by the metallic layers 64, 68, and 74 may be connected to one another as desired. A fourth metallic layer 78 is then formed on the third laminated substrate layer 76 (FIG. 5G). The fourth metallic layer 78 may be a grounding plate that serves as a reference for input and output signals transmitted through the metallic structure provided by the first metallic layer 64, second metallic layer 68, and third metallic layer 74. The fourth metallic layer 78 may be connected by the vias formed through the third laminated substrate layer 76. Thus, the fourth metallic layer 78 is coupled to the other metallic layers 64, 68, and 74.

Figure 5H:
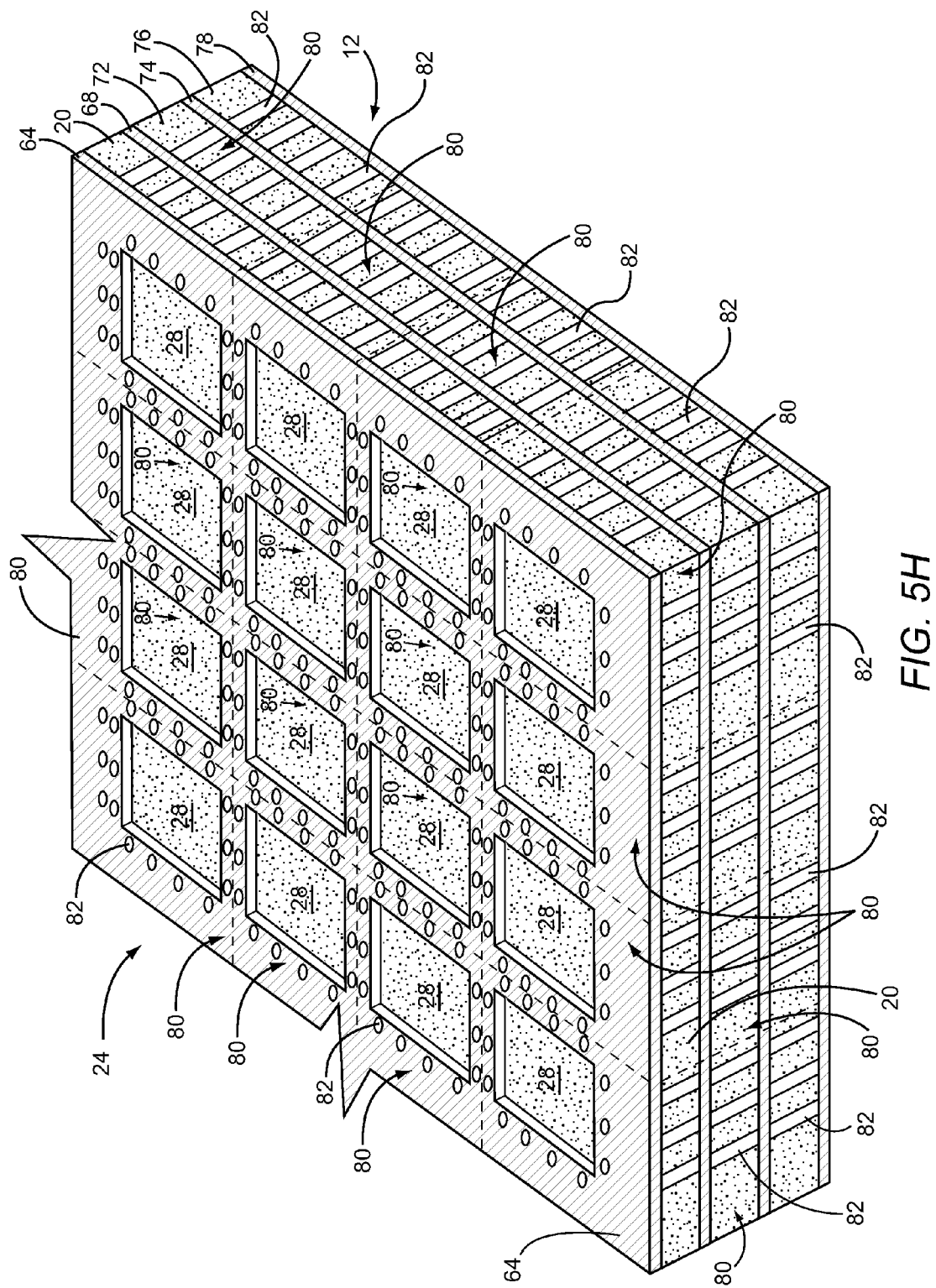

FIG. 5H shows a portion of the electronic component section 24 in the laminated substrate body 12 after the procedures described above in FIGS. 5A-5G. As shown in FIG. 5H, the electronic component section 24 has the component areas 28 for attaching electronic components. The first metallic layer 64 has been etched to expose the component areas 28 on the first laminated substrate layer 20.

The electronic component section 24 of the laminated substrate body 12 may thus be subdivided into component portions 80 each including one of the component areas 28. The component portions 80 are the portion of the laminated substrate body 12 that supports the structures of the electronic component to be mounted on the component area 28. Through the metallic layers 64, 68, 74, 78, and vias 82, each component portion 80 may include conductive paths that form internal and external connections to and from the electronic component mountable on the component area 28.

The first metallic layer 64, the first laminated substrate layer 20, the second metallic layer 68, the second substrate layer 72, the third metallic layer 74, the third laminated substrate layer 76, the fourth metallic layer 78, and the vias 82 form the structure of each of the component portions 80. Each of the component portions 80 may have different metallic components formed within the component portion 80 in accordance with the electronic component to be attached to the particular component area 28. As shown in FIG. 5H, the first metallic layer 64, the second metallic layer 68, the third metallic layer 74, and the fourth metallic layer 78 are coupled to one another through vias 82 formed through the first laminated substrate layer 20, the second substrate layer 72, and the third laminated substrate layer 76. In this manner, the metallic layers 64, 68, 74, and 78 may be coupled to one another.

Figure 5I:
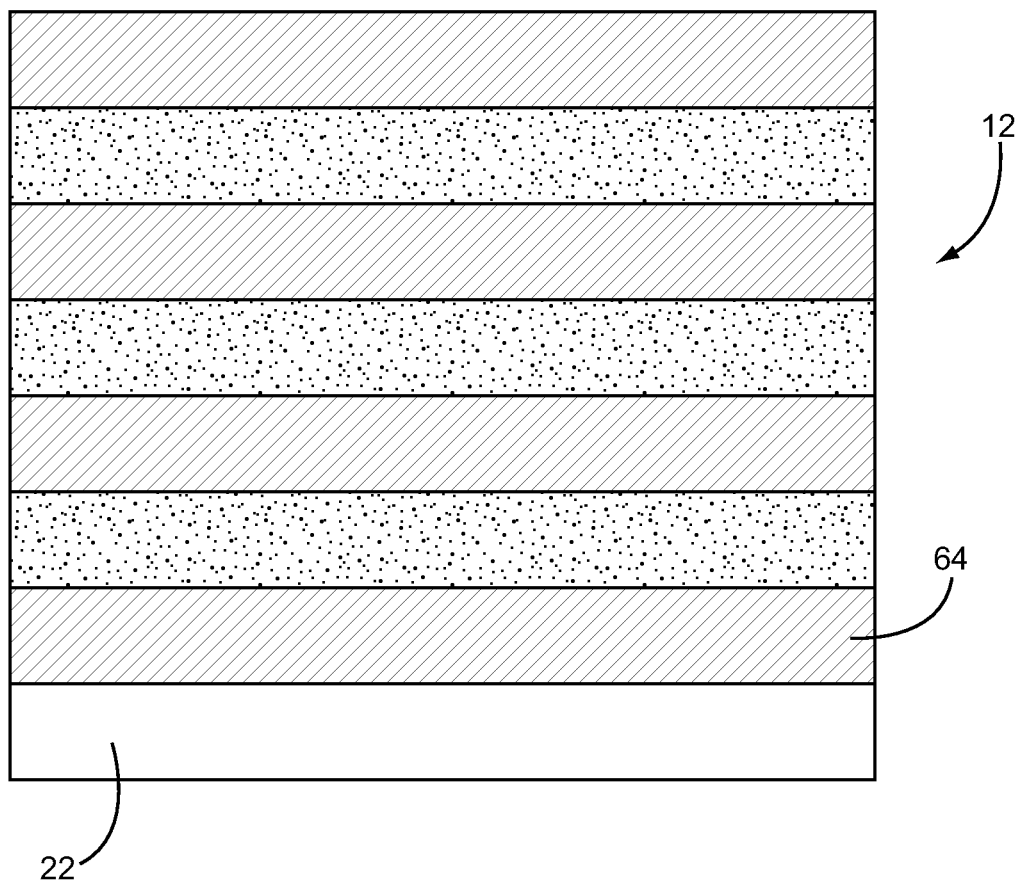
Figure 5J:
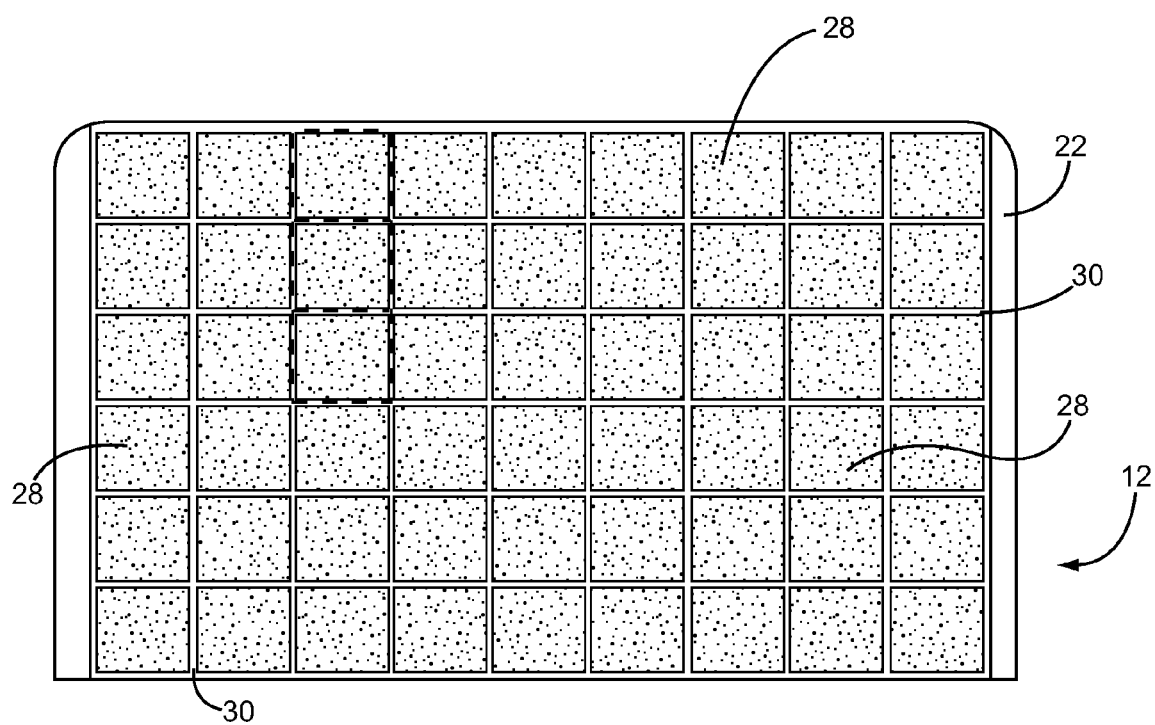

The solder mask 22 is then formed over the first metallic layer 64 and patterned (FIG. 5I). The solder mask 22 is patterned so that the electronic component sections 24 and 26, and the test vehicles 14, 16, 18 are exposed through the solder mask 22 (See FIG. 1). After the solder mask 22 has been patterned, channels 30 are cut into the laminated substrate body 12 around each of the component areas 28 (FIG. 5J). These channels 30 expose the appropriate metallic structures within the laminated substrate body 12 (the component portions 80 in FIG. 5H) in order to provide internal and external connections for electronic components.

Figure 5K:
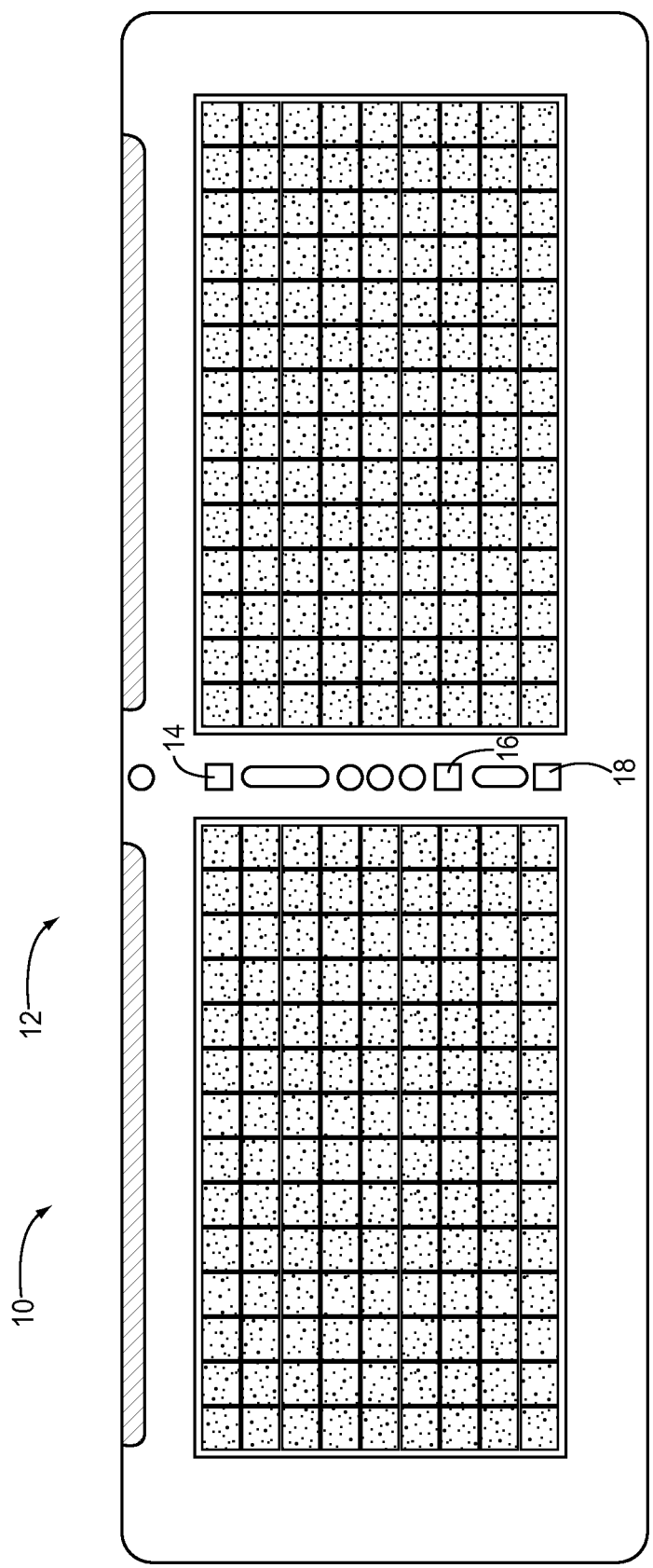

As a result, the laminated substrate 10 shown in FIG. 5K is formed (also shown in FIG. 1). As explained above, the laminated substrate body 12 of the laminated substrate 10 has various structural characteristics that may be non-destructively tested using the various test vehicles 14, 16, 18. The test vehicles 14, 16, 18 may be formed while forming the laminated substrate body 12. These test vehicles 14, 16, 18 are configured to test a structural characteristic of interest in the laminated substrate body 12. As a result, the electrical characteristic measurable from the test vehicle is indicative of the structural characteristic of the laminated substrate body 12 that is of interest. Based on the electrical characteristic measured from the test vehicles 14, 16, 18, individuals or computer systems can determine whether the structural characteristic of the laminated substrate body 12 is compliant with the structural requirement. Since the structural characteristic is determined from a by detecting electrical characteristics using the test vehicles 14, 16, and 18, whether the laminated substrate body 12 satisfies structural requirements is determinable without destroying the laminated substrate 10.

Figure 6A:
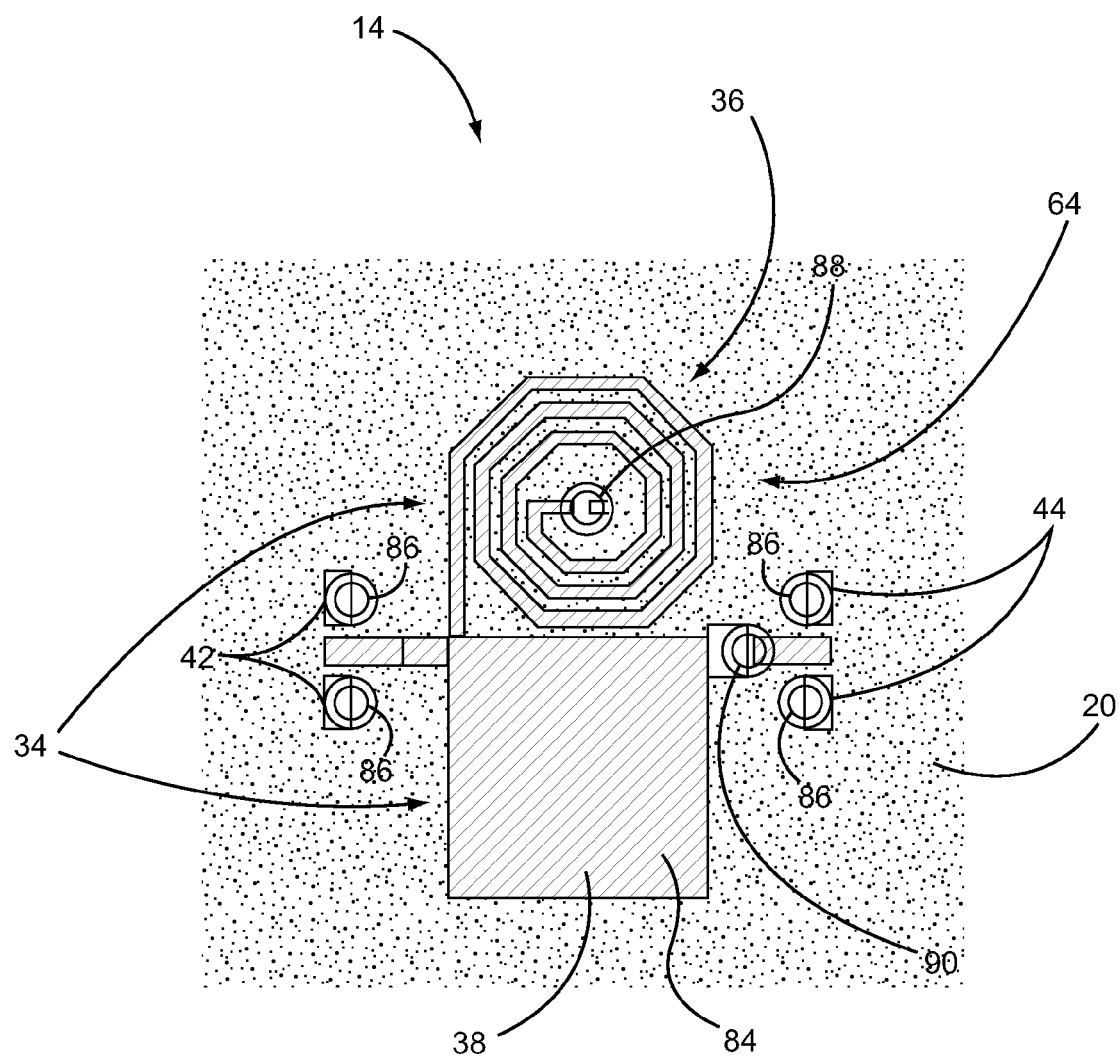
FIGS. 6A-6B illustrates exemplary procedures that may be implemented to form the first test vehicle shown in FIG. 2.
Figure 6B:
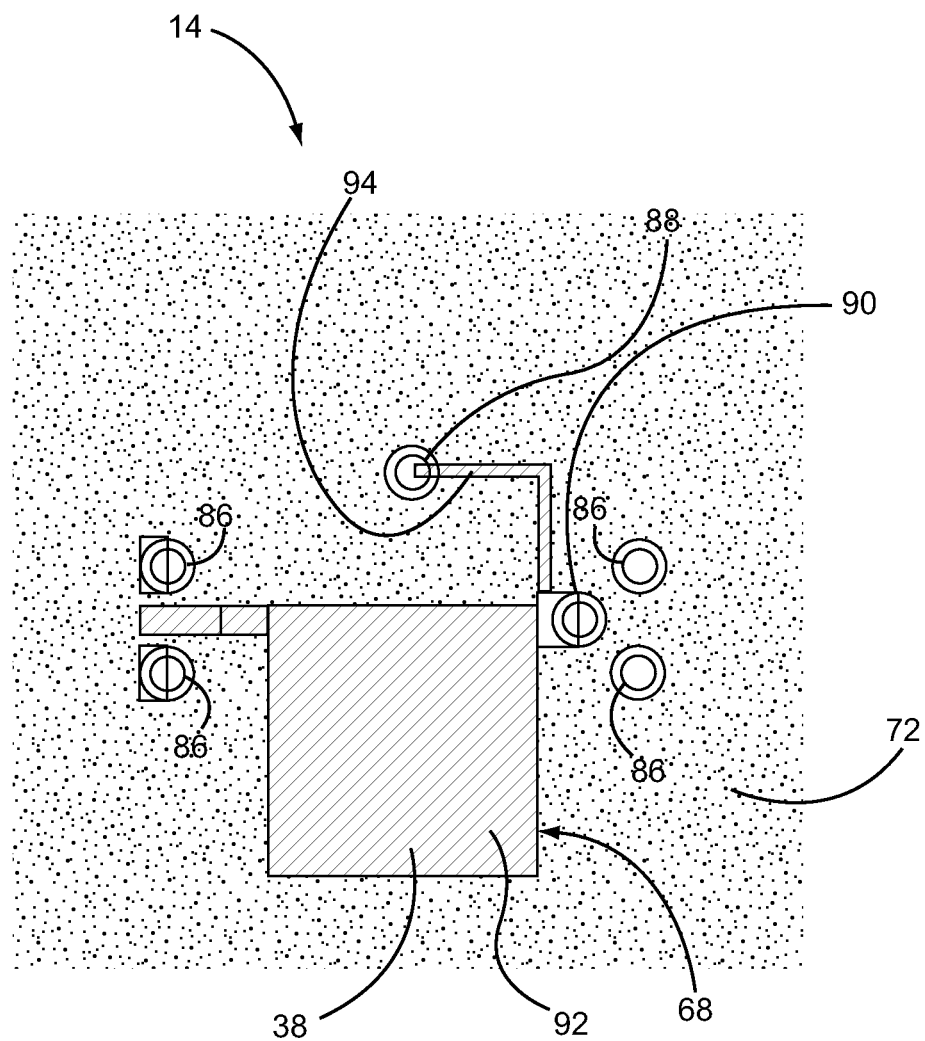

FIG. 6A-6B illustrates procedures for forming the first test vehicle 14. As explained above, the structural characteristic testable from the first test vehicle 14 is the thickness of the first laminated substrate layer 20. Again, the first test vehicle 14 is formed to have the resonant circuit 34, which has a resonant frequency based on the thickness of the first laminated substrate layer 20. Thus, the electrical characteristic that is detectable from the first test vehicle 14 is the resonant frequency.

FIG. 6A shows that the inductive component 36 and the first plate 84 of the capacitive component 38 are formed from the first metallic layer 64 of the laminated substrate body 12. The first plate 84 of the capacitive component 38 and the inductive component 36 may be formed when the first metallic layer 64 is patterned as discussed above in FIG. 5B. Also formed by the first metallic layer 64 are the input terminals 42 and the output terminals 44. The input terminals 42 and the output terminals 44 each include vias 86 that couple each of the input terminals 42 and the output terminals 44 to the fourth metallic layer 78 (see FIG. 5G) which serves as the grounding plate. Accordingly, the fourth metallic layer 78 serves as a reference for the input terminals 42 and the output terminals 44. The inductive component is connected through the first laminated substrate layer 20 to the second metallic layer 68 through a via 88. Similarly, the first plate 84 of the capacitive component 38 is coupled to the second metallic layer 68 with a via 90.

A second plate 92 of the capacitive component 38 is formed by the second metallic layer 68 of the laminated substrate body 12 (FIG. 6B). The second plate 92 is aligned with the first plate 84 shown in FIG. 6A so that the first plate 84 and the second plate 92 sandwich the first laminated substrate layer 20. The capacitive component 38 is formed so that the first laminated substrate layer 20 is the dielectric of the capacitive component 38. In this manner, the capacitance of the capacitive component 38 depends on the thickness of the first laminated substrate layer 20. The second plate 92 is provided between the first laminated substrate layer 20 and the second laminated substrate layer 72 as part of the second metallic layer 68. The second plate 92 may thus be formed during the patterning of the second metallic layer 68 as shown in FIG. 5C. A trace 94 is also formed by the second metallic layer 68. The trace 94 couples the second plate 92 of the capacitive component 88 to the inductive component 36 shown in FIG. 6A. The resonant circuit 34 formed by the first test vehicle 14 is thus a parallel LC circuit. FIG. 6B also shows the vias 86 which extend through the second laminated substrate layer 72 and to the grounding plate provided by the fourth metallic layer 78. It should be noted that similar procedures may be utilized to form the third test vehicle 18 shown in FIG. 1. In this case the inductive component 58 shown in FIG. 4 of the resonant circuit 54 is formed by the first metallic layer 64. The inductive component 58 may be formed during the procedure described above in FIG. 6B. However, the capacitive component (not shown) is formed with the second laminated substrate layer 72 as the dielectric of the capacitive component. Accordingly, the first plate of the capacitive component may be formed as part of the second metallic layer 68 as discussed above in FIG. 5C. On the other hand, the second plate of the capacitive component may be formed from the third metallic layer 74 during the procedure discussed above in FIG. 5E.

Figure 7A:
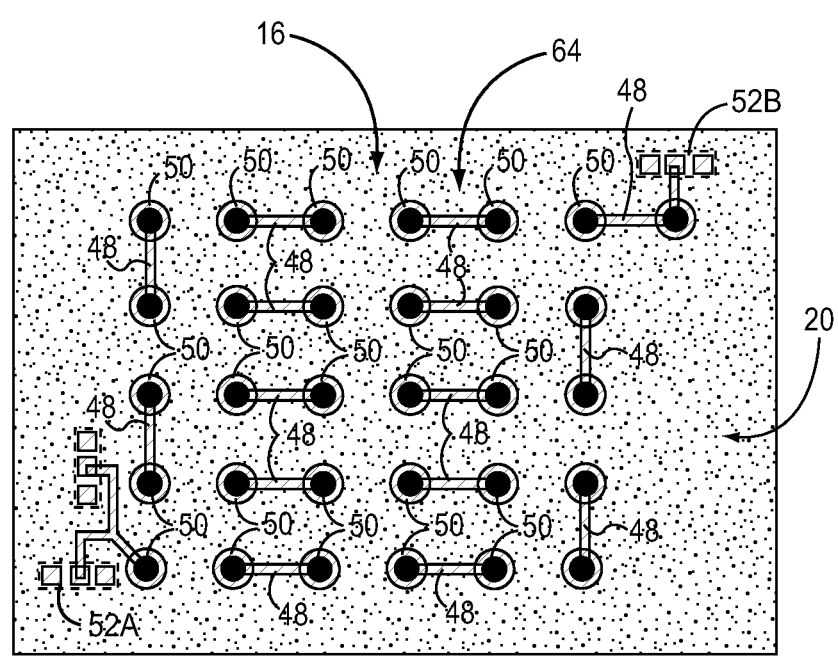
FIGS. 7A-7B illustrates exemplary procedures that may be implemented to form the second test vehicle shown in FIG. 3.
Figure 7B:
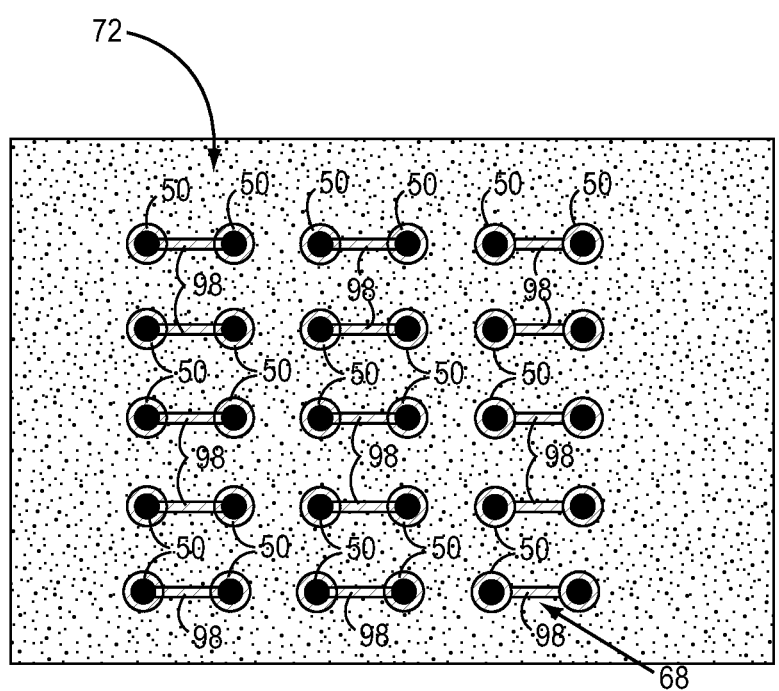

FIGS. 7A and 7B illustrates procedures for forming the second test vehicle 16. In FIG. 7A, the traces 48 are formed from the first metallic layer 64 on the first laminated substrate layer 20 of the laminated substrate body 12. The traces 48 may be patterned during the patterning of the first metallic layer 64 described above for FIG. 5B. Each of the traces 48 is coupled between the vias 50 as shown in FIG. 7A. Each of the vias 50 extend through the first laminated substrate layer 20 and attach to traces 98 formed by the second metallic layer 68 of the laminated substrate body 12 (FIG. 7B). As such, the metallic traces 98 may be formed from the second metallic layer 68 during the patterning of the second metallic layer 68 as discussed above in FIG. 5C. The traces 98 are thus formed by the second metallic layer, which is between the first laminated substrate layer 20 and the second laminated substrate layer 72 (See FIG. 5G). As the vias 50 extend through the first laminated substrate layer 20 and couple the traces 98 shown in FIG. 7B to the traces 48 shown in FIG. 7A, the resistive component is interweaved within the first laminated substrate layer 20. The procedures described above in FIGS. 7A and 7B may be repeated to interweave the resistive component within other laminated substrate layers such as the second laminated substrate layer 72 and the third laminated substrate layer 76.

Figure 8:
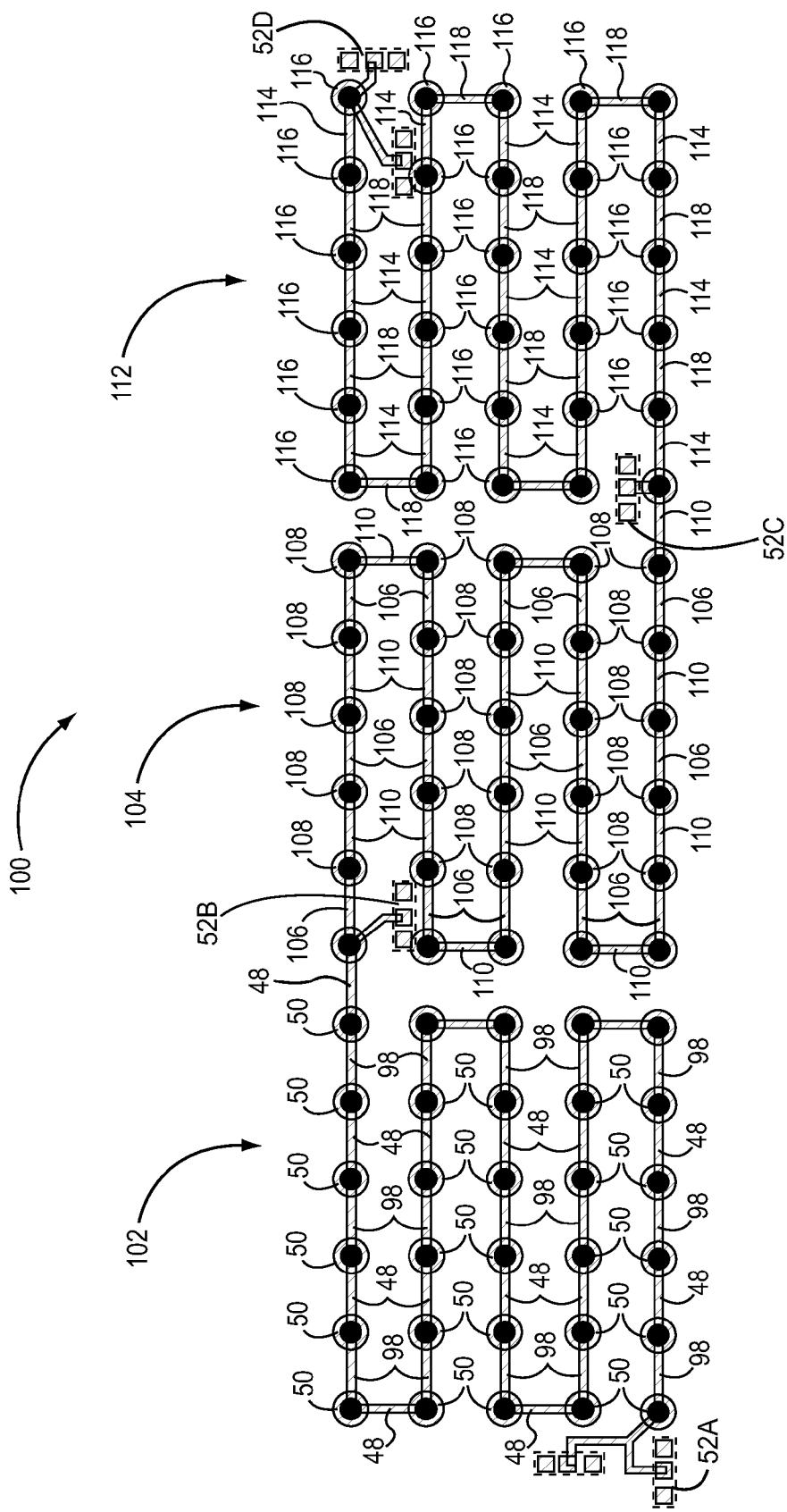
FIG. 8 illustrates an embodiment of a resistive component provided by the second test vehicle to test a uniformity of the laminated substrate layers in the laminated substrate.

FIG. 8 illustrates one embodiment of the resistive component 100 that provided by the second test vehicle 16. The procedures discussed in FIGS. 7A and 7B refer to the forming of a first segment 102 of the resistive component interweaved within the first laminated substrate layer 20. (The laminated substrate layers of the laminated substrate body 12 are not shown in FIG. 8 for the sake of clarity.) Also included in the resistive component 100 is a second segment 104 interweaved between the second laminated substrate layer 72 (shown in FIG. 5G). Traces 106 are formed in the second metallic layer 68 (shown in FIG. 5G) of the laminated substrate body. Accordingly, the traces 106 may be formed during the patterning of the second metallic layer 68 as discussed above in FIG. 5C. Vias 108 are formed through the second laminated substrate layer 72 to the third metallic layer 74 (shown in FIG. 5G). At the third metallic layer 74, traces 110 are formed and coupled between the vias 108. As such, the traces 110 may be formed during the patterning of the third metallic layer 74 as described above in FIG. 5E. The resistive component 100 also includes a third segment 112 interweaved between the third laminated substrate layer 76 (shown in FIG. 5G). The third segment 112 includes traces 114 formed in the third metallic layer 74. Each of the traces 114 is coupled to vias 116. The vias 116 extend through the third laminated substrate layer 76 (shown in FIG. 5G) to the fourth metallic layer 78 (shown in FIG. 5G). Traces 118 are formed in the fourth metallic layer 78 (shown in FIG. 5G) and coupled to the vias 116 formed in the third metallic layer 74. Thus, the traces 118 may be formed during the procedure discussed above in FIG. 5G through the patterning of the fourth metallic layer 78.

Input/output terminals 52 are exposed through the laminated substrate body 12 and through the solder mask 22 (shown in FIG. 1). Each of the segments 102, 104, and 112 has a resistance. Note that the segments 102, 104, 112 are also connected to one another. The first segment 102 is interweaved within the first laminated substrate layer 20 (shown In FIG. 5G). The resistance of the first segment 102 is thus indicative of the uniformity of the first laminated substrate layer 20. If the first laminated substrate layer 20 complies with the planar uniformity requirement, the first segment 102 is contiguous. If the uniformity of the first laminated substrate layer 20 does not comply with the planar uniformity requirement, the first segment will be broken and thus be non-contiguous. An ohmmeter may be coupled between the input/output terminal 52A and the input/output terminal 52B to detect the resistance of the first segment 102. If the first segment 102 is contiguous, the resistance of the first segment 102 is low. In essence, the resistance of the first segment 102 will appear almost as a short circuit. However, if the first segment is non-contiguous, the resistance of the first segment 102 is high. In essence, the resistance of the first segment 102 may approximate an open circuit. Analogously, the resistance of the second segment 104 indicates the uniformity of the second laminated substrate layer 72 (shown in FIG. 5G). An ohmmeter may be coupled between the input/output terminal 52B and the input/output terminal 52C to detect the resistance of the second segment 104. If the second segment 104 is contiguous, the resistance of the second segment will be lower while if the second segment 104 is non-contiguous, the resistance of the second segment will be higher. Additionally, the resistance of the third segment 112 indicates the uniformity of the third laminated substrate layer 76 (shown in FIG. 5G). An ohmmeter may be coupled between the input/output terminal 52C and the input/output terminal 52D to detect the resistance of the third segment 112. If the third segment 112 is contiguous, the resistance of the third segment 112 will be lower while if the resistance of the third segment 112 is non-contiguous, the resistance of the third segment 112 will be higher.

Finally, the resistive component 100 has a total resistance, which is the combination of the resistance of the first segment 102, the resistance of the second segment 104, and the resistance of the third segment 112. The total resistance of the resistive component 100 is thus indicative of the uniformity of the first laminated substrate layer 20 (shown in FIG. 5G), the second laminated substrate layer 72 (shown in FIG. 5G), and the third laminated substrate layer 76 (shown in FIG. 5G). An ohmmeter may be coupled between the input/output terminal 5A and the input/output terminal 52D to detect the total resistance of the resistive component 100. If none of the segments 102, 104, and 112 are broken, the resistive component is contiguous and thus indicates that the laminated substrate layers 20, 72, and 76 comply with the planar uniformity requirement. In one embodiment, the total resistance of the resistive component 100 is about 0.2 ohms when the resistive component 100 is contiguous. Essentially, the resistive component 100 appears almost as a short circuit. On the other hand, if any of the segments 102, 104, and 112 are broken the resistive component 100 is non-contiguous and fails to comply with the planar uniformity requirement. In this case, the resistance of the resistive component 100 is higher and may appear as almost an open circuit.

FIG. 9 illustrates one embodiment of a test fixture 120 configured to detect the electrical characteristics of the laminated substrate 10. The test fixture 120 includes electronic measurement devices 122 and 124 to implement procedures similar to those discussed above for FIG. 1A. For example, the electronic measurement device 122 may be an oscilloscope or a network analyzer. The electronic measurement device 122 may be coupled to the test vehicles 14, 18 to detect the resonant frequencies. Based on the resonant frequencies, the test fixture 120 may implement software with one or more microprocessor(s) (not shown) or may include hardwired circuits to determine whether the thickness of the laminated substrate layers 20, 72 (shown in FIG. 5G) is within the thickness range. Analogously, the electronic measurement device 124 (such as an ohmmeter) may be coupled to the test vehicle 16 to detect the resistance of the resistive component 100 (shown in FIG. 8). Based on the resistance, the test fixture 120 may implement software with one or more microprocessor(s) (not shown) or may include hardwired circuits to determine whether the uniformity of the laminated substrate layers 20, 72, 76 (shown in FIG. 5G) comply with the planar uniformity requirement. If the electronic characteristics indicate that the structural characteristics comply with the structural requirements, the test fixture 120 transmits a go signal 126. On the other hand, if the electronic characteristics indicate that one or more of the structural characteristics do not comply with the structural requirements, a no go signal 128 is transmitted. The go signal 126 and no go signal 128 may be utilized by other sorting equipment to sort the laminated substrate 10 into an appropriate bin.

Those skilled in the art will recognize improvements and modifications to the preferred embodiments of the present disclosure. All such improvements and modifications are considered within the scope of the concepts disclosed herein and the claims that follow.

What is claimed is:

1. A method of manufacturing a laminated substrate, comprising:
   forming a laminated substrate body having a structural characteristic;
   forming a test vehicle operably associated with the laminated substrate body so that an electrical characteristic measurable from the test vehicle is indicative of the structural characteristic of the laminated substrate body, wherein the test vehicle includes at least one integrated component and is integrated into the laminated substrate body.

2. The method of claim 1 wherein the test vehicle is formed while forming the laminated substrate body.

3. The method of claim 1 wherein forming the laminated substrate body having the structural characteristic comprises:
   forming a plurality of laminated substrate layers so that the laminated substrate body comprises the plurality of laminated substrate layers.

4. The method of claim 3 wherein forming the test vehicle comprises:
   forming a resistive component interweaved within at least one of the plurality of laminated substrate layers, wherein the electrical characteristic is a resistance of the resistive component and the structural characteristic is a uniformity within the at least one of the laminated substrate layers of the laminated substrate body.

5. The method of claim 3 wherein forming the test vehicle operable to detect the electrical characteristic comprises:
   forming a resonant circuit having a resonant frequency based on a thickness of one or more of the plurality of laminated substrate layers, wherein the electrical characteristic is the resonant frequency and the structural characteristic is the thickness.

6. The method of claim 5 wherein forming the resonant circuit comprises:
   forming a capacitive component with the one or more of the plurality of laminated substrate layers as a dielectric of the capacitive component so that a capacitance of the capacitive component depends on the thickness of the one or more of the plurality of laminated substrate layers.

7. The method of claim 1 further comprising:
   detecting the electrical characteristic of the laminated substrate body; and
   determining whether the structural characteristic of the laminated substrate body is compliant with a structural requirement based on the electrical characteristic.

8. The method of claim 7 wherein:
   the laminated substrate body comprises a plurality of laminated substrate layers;
   the electrical characteristic is a resonant frequency;
   the structural characteristic is a thickness of at least one laminated substrate layer of the plurality of laminated substrate layers;
   the structural requirement is a thickness range; and
   wherein determining whether the structural characteristic of the laminated substrate body is compliant with the structural requirement based on the electrical characteristic comprises determining, from the resonant frequency, whether the thickness of the at least one laminated substrate layer of the plurality of laminate substrate layers is within the thickness range.

9. The method of claim 8 wherein detecting the electrical characteristic of the laminated substrate body, comprises:
transmitting a test signal into the test vehicle; and
measuring the resonant frequency from the test signal.

10. The method of claim 7 wherein the laminated substrate body comprises a plurality of laminated substrate layers and the test vehicle has a resistive component interweaved within at least one of the plurality of laminated substrate layers, the electrical characteristic being a resistance of the resistive component, the structural characteristic being a uniformity of the at least one of the plurality of laminated substrate layers of the laminated substrate body, the structural requirement is a planar uniformity requirement of the at least one of the plurality of laminated substrate layer and wherein determining whether the structural characteristic of the laminated substrate body is compliant with the structural requirement based on the electrical characteristic comprises:
determining whether the resistance is approximately equal to a control resistance wherein the resistance of the resistive component indicates that the uniformity of the at least one of the plurality of laminated substrate layers is compliant with the planar uniformity requirement if the resistance is approximately equal to the control resistance and the resistance of the resistive component indicates that the uniformity of the at least one of the plurality of the laminated substrate layers fails to comply with the planar uniformity requirement if the resistance is greater than approximately the control resistance.

11. The method of claim 10 wherein detecting the electrical characteristic of the laminated substrate body, comprises:
transmitting a test signal into the test vehicle; and
measuring the resistance of the resistive component from the test signal.

12. A laminated substrate, comprising:
a laminated substrate body having a structural characteristic;
a test vehicle operably associated with the laminated substrate body so that an electrical characteristic measurable from the test vehicle is indicative of the structural characteristic of the laminated substrate body, wherein the test vehicle includes at least one integrated component and is integrated into the laminated substrate body.

13. The laminated substrate of claim 12 wherein the laminated substrate body comprises a plurality of laminated substrate layers.

14. The laminated substrate of claim 13 wherein:
the test vehicle comprises a resonant circuit having a resonant frequency based on a thickness of one or more of the plurality of laminated substrate layers;
the electrical characteristic is the resonant frequency; and
the structural characteristic is the thickness.

15. The laminated substrate of claim 14 wherein:
the resonant circuit comprises a capacitive component; and
the one or more of the plurality of laminated substrate layers are configured to provide a dielectric of the capacitive component so that a capacitance of the capacitive component depends on the thickness of the one or more of the plurality of laminated substrate layers.

16. The laminated substrate of claim 13 wherein:
the test vehicle comprises a resistive component interweaved within at least one of the plurality of laminated substrate layers;
the electrical characteristic is a resistance of the resistive component;
the structural characteristic is a uniformity of the at least one of the laminated substrate layers of the laminated substrate body.

17. The laminated substrate of claim 16 wherein:
the resistive component is interweaved such that, if the uniformity complies with a planar uniformity requirement, the resistive component is contiguous and, if the uniformity does not comply with a planar uniformity requirement, the resistive component is noncontiguous.

18. The laminated substrate of claim 17 wherein the resistance of the resistive component is lower if the resistive component is contiguous and the resistance of the resistive component is higher if the resistive component is noncontiguous.

* * * * *